United States Patent [19]

Hannai

[11] Patent Number: 5,465,234
[45] Date of Patent: Nov. 7, 1995

[54] SEMICONDUCTOR MEMORY DEVICE HAVING SHIFTING CIRCUIT CONNECTED BETWEEN DATA BUS LINES AND DATA BUFFER CIRCUITS FOR CHANGING CONNECTIONS THEREBETWEEN

[75] Inventor: Seiichi Hannai, Tokyo, Japan

[73] Assignee: NEC Corporation, Tokyo, Japan

[21] Appl. No.: 347,078

[22] Filed: Nov. 23, 1994

[30] Foreign Application Priority Data

Nov. 26, 1993 [JP] Japan .................................. 5-296501

[51] Int. Cl.⁶ .................................................. G11C 13/00
[52] U.S. Cl. ................ 365/200; 365/189.05; 365/230.03
[58] Field of Search .............................. 365/200, 189.01, 365/96, 189.05, 230.03

[56] References Cited

U.S. PATENT DOCUMENTS 5,394,369  2/1995  Kagami .................................. 365/200

FOREIGN PATENT DOCUMENTS 61-17299  1/1986  Japan .
63-10520  3/1988  Japan .

*Primary Examiner*—Terrell W. Fears
*Attorney, Agent, or Firm*—Popham, Haik, Schnobrich & Kaufman, Ltd.

[57] ABSTRACT

A semiconductor memory device has a plurality of memory cell sub-arrays selectively used as a data storage for prohibiting a defective memory cell sub-array from a data access, and a shifting circuit couples the available memory cell sub-arrays to input and output data buffer circuits higher in a priority than another input and output data buffer circuit regardless of the location of the defective memory cell sub-array in the plurality of memory cell sub-arrays so as to share a printed circuit board between the semiconductor memory devices with the partially available memory cell sub-arrays.

6 Claims, 6 Drawing Sheets

| MEMORY CELL SUB-ARRAYS | | | | FUSE ELEMENT | | | | | | |
|---|---|---|---|---|---|---|---|---|---|---|
| 22a | 22b | 22c | 22d | F11 | F21 | F12 | F22 | F13 | F23 | F31 |
| ○ | ○ | ○ | ○ | — | B | — | B | — | B | — |
| × | ○ | ○ | ○ | B | — | B | — | B | — | B |
| ○ | × | ○ | ○ | — | B | B | — | B | — | B |
| ○ | ○ | × | ○ | — | B | — | B | B | — | B |
| ○ | ○ | ○ | × | — | B | — | B | — | B | B |

Fig. 6

SEMICONDUCTOR MEMORY DEVICE HAVING SHIFTING CIRCUIT CONNECTED BETWEEN DATA BUS LINES AND DATA BUFFER CIRCUITS FOR CHANGING CONNECTIONS THEREBETWEEN

FIELD OF THE INVENTION

This invention relates to a semiconductor memory device and, more particularly, to a semiconductor memory device having a shifting circuit connected between data bus lines and input/output data buffer circuits for steering data bits from the input/output data buffer circuit to available memory cell sub-arrays.

DESCRIPTION OF THE RELATED ART

A typical example of the semiconductor memory device is illustrated in FIG. 1 of the drawings, and the prior art semiconductor memory device comprises a regular memory cell array 1 accompanied with a row of redundant memory cells 1a and columns of redundant memory cells 1b. If a row of regular memory cells contains a defective memory cell, the defective row of regular memory cells is replaced with the row of redundant memory cells. On the other hand, if a defective memory cell is found in a column of regular memory cells, the defective column of regular memory cells and associated columns of regular memory cells are replaced with the columns of redundant memory cells.

The prior art semiconductor memory device further comprises regular word lines WL0 to WLm shared between the regular memory cell array 1 and the columns of redundant memory cells 1b, a redundant word line RWL for replacing a row of regular memory cells with the row of redundant memory cells, a row address decoder/word line driver unit 2a coupled to the regular word lines WL0 to WLm and a redundant word line driver unit 2b coupled to the redundant word line RWL instead of the regular word lines WL0 to WLm.

When row address predecoded signals ADR are supplied to the row address decoder/word line driver unit 2a, the row address decoder/word line driver unit activates one of the regular word lines WL0 to WLm insofar as the row address predecoded signals does not indicate a row address assigned to the defective row of regular memory cells.

On the other hand, if the row address predecoded signals are indicative of the row address of the defective row of regular memory cells, the row address decoder/word line driver unit 2a maintains the regular word lines WL0 to WLm in inactive level, and the redundant word line driver unit 2b activates the redundant word line RWL. Therefore, the regular word lines WL0 to WLm and the row address decoder/word line driver unit 2a make a row of the regular memory cells and one of the redundant memory cells 1b accessible.

The prior art semiconductor memory device further comprises regular bit line pair groups BL0 to BLn shared between the regular memory cell array 1 and the redundant memory cells 1a, a redundant bit line pair group RBL coupled to the columns of redundant memory cells 1b, a column address decoder/column selector unit 3a coupled between the regular bit line pair groups BL0 to BLn and four data line pairs DL1, DL2, DL3 and DL4 and a redundant column selector unit $3_b$ coupled between the redundant bit line pair group RBL and the data line pairs DL1 to DL4.

When column address predecoded signals ADC are indicative of a column address assigned to one of the regular bit line pair groups BL0 to BLn not replaced with the redundant bit line pair group RBL, the column address decoder/column selector unit 3a couples the regular bit line group to the data line pairs DL1 to DL4. However, if the column address predecoded signals ADC selects the column address assigned to the defective bit line group, the column address decoder/column selector unit 3a isolates the data line pairs DL1 to DL4 from the regular bit line pair groups BL0 to BLn, and the redundant bit line pair selector unit 3b connects the redundant bit line pair group to the data line pairs DL1 to DL4.

The prior art semiconductor memory device further comprises four input/output data buffer circuits 4a, 4b, 4c and 4d coupled between the data line pairs DL1 to DL4 and input/output data pins P1, P2, P3 and P4, respectively. The data bits are transferred from either regular or redundant bit line pair group through the data line pairs DL1 to DL4 to the input/output data buffer circuits 4a to 4d, and the input/output data buffer circuits 4a to 4d supply a 4-bit output data signal to the input/output data pins P1 to P4.

On the other hand, a 4-bit input data signal is supplied from the input/output data pins P1 to P4 to the input/output data buffer circuits 4a to 4d, and four write-in data bits are transferred from the input/output data buffer circuits 4a to 4d through the data line pairs DL1 to DL4 to the column address decoder/column selector unit 3a and the redundant column selector unit $3_b$. One of the column address decoder/column selector unit 3a and the redundant column selector unit 3b transfers the write-in data bits to one of the bit line pair groups BL0 to BLn or the redundant bit line pair group RBL.

FIG. 2 illustrates a circuit configuration of the redundant word line driver unit 2b, and comprises a plurality of series combinations of fuse elements FS0/ FSC0/FS1/FSC0/FSi/. . . /FSCi and n-channel enhancement type switching transistors Qn1/Qn2/Qn3/ Qn4/. . . /Qni/ Qnj coupled between a positive power voltage line Vdd and a ground voltage line GND and a p-channel enhancement type charging transistor Qp1. The row address predecoded signals AR0/CAR0/AR1/CAR1/ARi/CARi are respectively supplied to the gate electrodes of the n-channel enhancement type switching transistors Qn1 to Qnj, and a precharge control signal PC is supplied to the gate electrode of the p-channel enhancement type charging transistor Qp1. The fuse elements FS0 to FSCi are selectively broken for storing the row address assigned to the defective row of regular memory cells. The circuit configuration shown in FIG. 2 is disclosed in Japanese patent Publication of Examined Application No. 63-10520.

Assuming now that the row address is expressed as "10 . . . 1", the fuse elements FS0, FSC1, . . . and FSi are broken by a laser beam, and the row address predecoded signals of logic "1" level are supplied to the gate electrodes of the n-channel enhancement type switching transistors associated with the broken fuse elements. If the stored row address is matched with the row address expressed by the row address predecoded signals ADR, no discharging path is provided from the p-channel enhancement type charging transistor Qp1 and the ground voltage line GND, and the p-channel enhancement type charging transistor Qp1 boosts the redundant word line RWL to the active high level.

On the other hand, if the row address expressed by the row address predecoded signals ADR is different from the stored address, current flows through at least one series combination of non-broken fuse element and the n-channel enhancement type switching transistor, and the redundant word line RWL is maintained in the inactive low level.

The redundant bit line selecting unit 3b is similar to the redundant word line driving unit 3b.

Thus, the row of redundant memory cells 1a and the columns of redundant memory cells 1b rescues a defective semiconductor memory device from rejection by replacing defective memory cells therewith, and the redundant facility enhances the production yield of the prior art semiconductor memory.

However, if the defective memory cells are more than the row of redundant memory cells 1a or the columns of redundant memory cells 1b, the prior art redundant facility can not rescue the semiconductor memory device. Another rescuing technology is proposed in Japanese Patent Publication of Unexamined Application No. 61-17299, and an address buffer incorporated in the prior art semiconductor memory device disclosed therein prohibits a memory cell sub-array not rescued through replacement with redundant memory cells from a data access.

FIG. 3 illustrates the address buffer circuit 11 associated with a protective circuit 12 for an address pin An. The address pin An is coupled to a protective resistor R1, and the protective circuit 12 implemented by a field effect transistor Q1 is coupled between the resistor R1 and a ground voltage line GND.

The address buffer circuit 11 comprises a three inverters INV1, INV2 and INV3 coupled between a positive power voltage line Vdd and the ground voltage line GND and two fuse elements F1 and F2, and the inverters INV1, INV2 and INV3 are implemented by depletion type/enhancement type field effect transistors Qd2/Qe3, Qd4/Qe5 and Qd6/Qe7. The fuse elements F1 and F2 are inserted between the depletion type field effect transistor Qd4 and the enhancement type field effect transistor Qe5 and between the depletion type field effect transistor Qd6 and the enhancement type field effect transistor Qe7, respectively. The gate electrodes of the depletion type field effect transistors Qd2, Qd4 and Qd6 are respectively connected to the output nodes N1, N2 and N3 of the inverters INV1 to INV3, and the resistor R1 and the output nodes N1 and N2 are respectively coupled to the gate electrodes of the enhancement type field effect transistors Qe3, Qe5 and Qe7 serving as input nodes of the inverters INV1 to INV3. The output node N3 serves as an output node of the address buffer circuit 1, and an address signal A0 is supplied from the output node N3 to an addressing system (not shown).

An external address bit supplied to the address pin An is indicative of either half of the memory cell array (not shown). If one of the halves of the memory cell arrays contains defective memory cells more than redundant memory cells, the manufacturer blows one of the fuse elements F1/F2, and fixes the address signal A0 to one of the two levels.

For example, when the defective half is selective by the address signal A0 of the low level, the fuse element F2 is broken, and the depletion type field effect transistor Qd6 fixes the address signal A0 to the high level. As a result, the excellent half is accessed at all times regardless of the external address bit at the address pin An.

On the other hand, if the defective half is specified by the address signal of the high level, the fuse element F1 is broken, and the other fuse element couples the output node N3 to the enhancement type field effect transistor Qe7. The positive high voltage level Vdd is supplied through the depletion type field effect transistor Qd4 regardless of the external address bit at the address pin An, and the enhancement type field effect transistor Qe7 is turned on at all times. As a result, the address signal A0 is fixed to the low level, and the excellent half is accessed at all times.

Although the broken fuse element decreases the memory capacity to a half of the original memory capacity, the manufacturer can sell the semiconductor memory device as a small data storage.

When the memory cell array is excellent, any fuse elements F1 and F2 are never broken, and the address signal A0 is changed depending upon the external address bit at the address pin An.

If the memory cell array is divided into quarters, the pair of fuse elements F1 and F2 are incorporated in each of the two address buffer circuits, and the manufacturer selectively prohibits the quarters of the memory cell array from data access. A manufacturer is, by way of example, assumed not to rescue one of the four memory cell sub-arrays forming a 16 mega-bit memory cells with the redundant memory cells, and prohibits the defective memory cell sub-array from a data access by blowing a fuse element incorporated in the address buffer circuit. The semiconductor memory device can be sold as a 12 mega-bit semiconductor memory device.

If the four memory cell sub-arrays are respectively coupled through the data line pairs DL1 to DL4 to the input/output data buffer circuits 4a to 4d shown in FIG. 1, three input/output data buffer circuits are available, and the input/output data buffer circuit associated with the defective memory cell sub-array is prohibited from the data access.

However, a problem is encountered in the prior art semiconductor memory device partially prohibited from a data access in that the manufacturer and a user tailor a test program sequence and a printed circuit board depending upon the prohibited input/output data buffer or buffers, and the semiconductor memory device partially prohibited is inconvenient to both manufacturer and user.

SUMMARY OF THE INVENTION

It is therefore an important object of the present invention to provide a semiconductor memory device which communicates with an external device through arbitrary data buffer circuits.

To accomplish the object, the present invention proposes to provided a shifting circuit between data line pairs and data buffer circuits.

In accordance with the present invention, there is provided a semiconductor memory device comprising: a) a memory cell array divided into a plurality of memory cell sub-arrays each implemented by a plurality of addressable memory cells for storing internal data bits, respectively; b) a plurality of data buffer circuits operative to change data bits between the internal data bits and external data bits, and having respective priorities different from one another; c) an addressing means operative to couple selected addressable memory cells respectively selected from the plurality of memory cell sub-arrays to the plurality of data buffer circuits; and d) a shifting circuit coupled between the addressing means and the plurality of data buffer circuits, and operative to respectively connect the plurality of memory cell sub-arrays to the data buffer circuits when a defective memory cell sub-array with a defective memory cell is not incorporated in the plurality of memory cell sub-arrays, the shifting circuit being further operative to connect available memory cell sub-arrays without the defective memory cell to the data buffer circuits in an order of the priority and to isolate the defective memory cell sub-array or sub-arrays from the data buffer circuit or circuits lower in the priority.

BRIEF DESCRIPTION OF THE DRAWINGS

The feature and advantages of the semiconductor memory device according to the present invention will be more clearly understood from the following description taken in conjunction with the accompanying drawings in which:

FIG. 6 is a view showing broken fuses of the shifting circuit: and

DESCRIPTION OF THE PREFERRED EMBODIMENTS

First Embodiment

Figure 1:
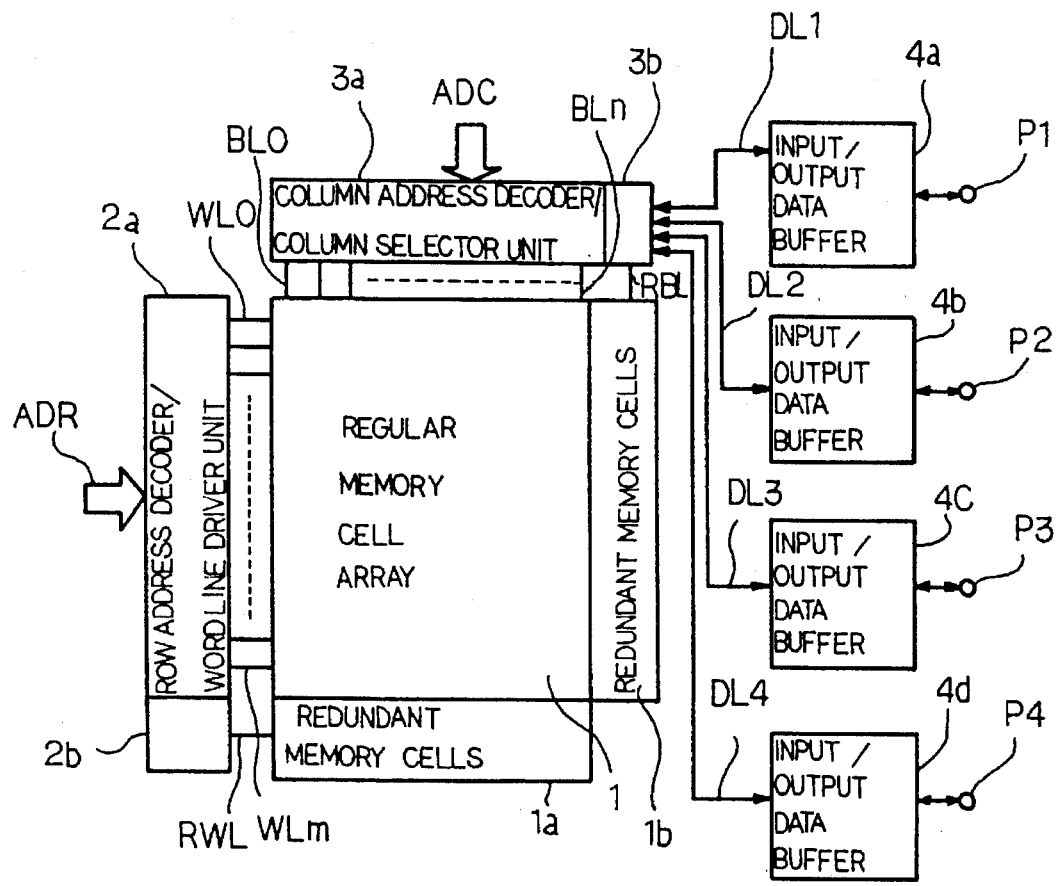
FIG. 1 is a block diagram showing the arrangement of the prior art semiconductor memory device with the redundant memory cells.
Figure 2:
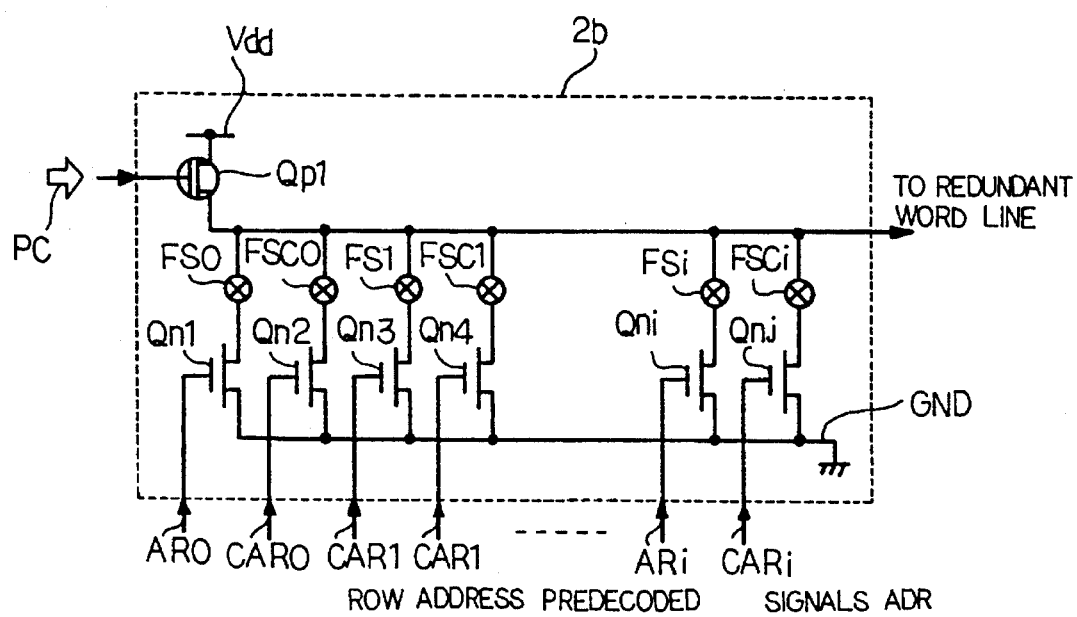
FIG. 2 is a circuit diagram showing the arrangement of the redundant word line driver incorporated in the prior art semiconductor memory device.
Figure 3:
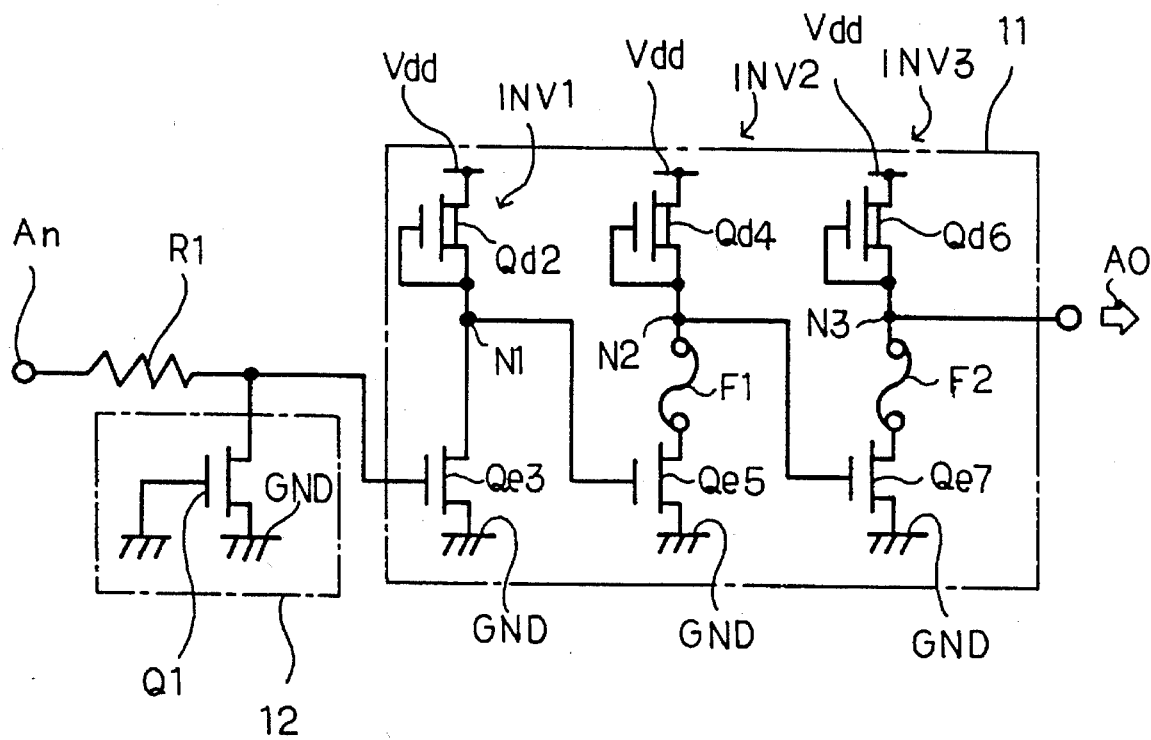
FIG. 3 is a circuit diagram showing the arrangement of the address buffer circuit incorporated in another prior art semiconductor memory device for partially prohibiting the memory cell array from a data access.
Figure 4:
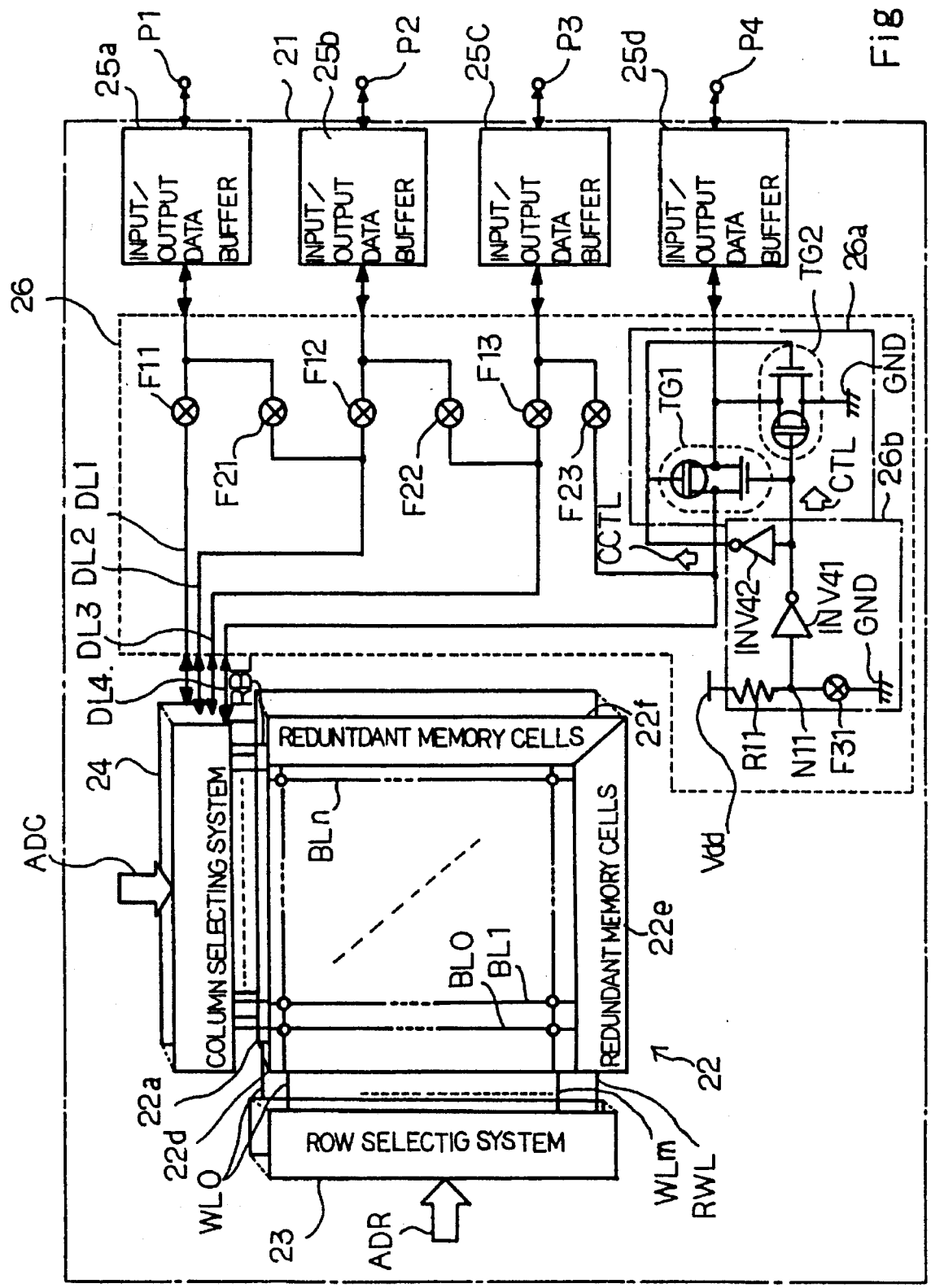
FIG. 4 is a block diagram showing the arrangement of a semiconductor memory device according to the present invention.

Referring to FIG. 4 of the drawings, a semiconductor memory device embodying the present invention is fabricated on a semiconductor chip 21, and comprises a memory cell array 22 divided into four memory cell sub-arrays 22a to 22d. Each of the memory cell sub-arrays 22a to 22d has a plurality of regular memory cells arranged in rows and columns, a row of redundant memory cells 22e and a column of redundant memory cells 22f. The redundant memory cell is identical in circuit configuration with the regular memory cell, and small circles stand for some of the regular memory cells of the memory cell sub-array 22a. Data bits are respectively stored in the regular/redundant memory cells, and are rewritable.

The semiconductor memory device further comprises a plurality of sets of regular and redundant word lines WL0 to WLm and RWL respectively associated with the memory cell sub-arrays 22a to 22d and a plurality of sets of regular and redundant bit line pairs BL0, BL1, . . . , BLn and RBL also associated with the memory cell sub-arrays 22a to 22d, respectively. Row addresses are respectively assigned to the regular word lines WL0 to WLm of each word line set, and column addresses are respectively assigned to the regular bit line pairs BL0 to BLn.

The regular word lines WL0 to WLm are coupled to the respective rows of regular memory cells and the respective redundant memory cells 22f of the associated memory cell sub-array, and the redundant word line RWL is coupled to the associated row of redundant memory cells 22e. On the other hand, the regular bit line pairs BL0 to BLn are coupled to the respective columns of regular memory cells and the respective redundant memory cells 22e, and the redundant bit line pair RBL is coupled to the associated column of the redundant memory cells 22f.

If a row of regular memory cells contains a defective memory cell not available for storing a data bit, the defective row of regular memory cells is replaced with the row of redundant memory cells 22e. On the other hand, if a column of regular memory cells contains a defective memory cell, the defective column of regular memory cells is replaced with the column of redundant memory cells.

When one of the regular or redundant word lines WL0–WLm and RWL is activated to an active level, the regular and/or redundant memory cells are coupled to the associated bit line pairs, and data bits are transferred between the regular and/or redundant memory cells and the associated bit line pairs, respectively.

The semiconductor memory device further comprises a row selecting system 23 and a column selecting system 24, and the row selecting system 23 and the column selecting system 24 are coupled to the regular and redundant word lines WL0 to WLm and RWL and the regular and redundant bit line pairs BL0 to BLn and RBL.

The row selecting system 23 has a decoder unit, a regular word line driver unit, a redundant circuit and a redundant word line driver unit. The decoder unit is responsive to row address predecoded signals ADR indicative of one of the row addresses for selecting one of the regular word lines WL0 to WLm from each word line set, and the regular word line driver unit activates the selected regular word lines to the active level in the absence of a disable signal supplied from the redundant circuit. The redundant circuit stores the row addresses assigned to the defective rows of regular memory cells found in the respective memory cell sub-arrays 22a to 22d in a nonvolatile manner, and the compares the row address represented by the row address predecoded signals ADR with the stored row addresses.

If the row address is not matched with the stored row addresses, the disable signal is not generated, and the regular word line driver unit activates the selected regular word lines. The redundant word line driver unit maintains the redundant word lines RWL to the inactive level.

However, if the row address is matched with one of the stored row addresses, the redundant circuit supplies the disable signal to the regular word line driver unit for maintaining the selected regular word line to an inactive level, and causes the redundant word line driver to activate the redundant word line RWL to the active level instead of the selected regular word line. The other selected regular word lines are activated as usual.

The column selecting system comprises a column address decoder unit responsive to column address predecoded signals ADC representing one of the column addresses, a regular column selector unit coupled between the sets of regular bit line pairs and four data line pairs DL1 to DL4, a redundant circuit and transfer gates respectively coupled to the redundant bit line pairs RBL and the four data line pairs DL1 to DL4. The four data line pairs are respectively associated with the four memory cell sub-arrays 22a to 22d, and the regular column selector unit and the transfer gates couples four regular/redundant bit line pairs respectively selected for the four memory cell sub-arrays 22a to 22d to the four data line pairs DL1 to DL4.

The redundant circuit of the column selecting system stores column addresses respectively assigned to the defective columns of regular memory cells, and compares the column address represented by the column address predecoded signals with the stored column addresses for changing the defective bit line pairs to the associated redundant bit line pairs RBL.

If the column address is matched with one of the stored column addresses, the redundant circuit disables the regular column selector unit not to couple the defective bit line pair with the associated data line pair, and the associated transfer gate couples the redundant bit line pair RBL to the associated data line pair.

On the other hand, if the column address is not matched with the stored column addresses, the regular column selector unit couples four regular bit line pairs respectively associated with the four memory cell sub-arrays 22a to 22d to the associated four data line pairs DL1 to DL4.

In this instance, the sets of regular and redundant word lines WL0 to WLm and RWL, the sets of regular and redundant bit line pairs BL0 to BLn and RBL, the row selecting system 23 and the column selecting system 24 as a whole constitute an addressing means.

The semiconductor memory device further comprises four input/output data buffer circuits 25a, 25b, 25c and 25d respectively coupled to data pins P1, P2, P3 and P4 and a shifting circuit 26 coupled between the four data line pairs DL1 to DL4 and the four input and output data buffer circuits 25a to 25d. The input and output data buffer circuits 25a to 25d generates an output data signal from potential differences on the data line pairs DL1 to DL4 in a read-out phase and potential difference from an input data signal in a write-in phase.

The shifting circuit 26 comprises first blowable fuse elements F11, F12 and F13 respectively coupled between the data line pairs DL1, DL2 and DL3 and the input/output data buffer circuits 25a, 25b and 25c, second blowable fuse elements F21, F22 and F23 coupled between the data line pairs DL2, DL3 and DL4 and the input/output data buffer circuits 25a, 25b and 25c, an isolating circuit 26a coupled between the data line pair DL4 and the input/output data buffer circuit 25d and a gate control circuit 26b for controlling the isolating circuit 26a. In this instance, the input/output data buffer circuits 25a, 25b and 25c have higher priority, and the input/output data buffer circuit 25d has lower priority.

In this instance, the fuse elements F11 to F13 and the fuse elements F21 to F23 form in combination a switching unit.

The gate control circuit 26b comprises a series of a resistor R11 and a blowable fuse element F31 coupled between a positive power voltage line Vdd and a ground voltage line GND and a series of inverters INV41 and INV42 coupled to a node N11 between the resistor R11 and the blowable fuse element F31, and a gate control signal CTL and the complementary gate control signal CCTL are generated by the inverters INV41 and INV42, respectively. The fuse element F31 is much smaller in resistance than the resistor R11.

While the fuse element F31 is connecting the resistor R11 to the ground voltage line GND, the gate control signal CTL is maintained at a high level, and, accordingly, the complementary gate control signal CCTL remains at a low level. However, if the fuse element F31 is broken, the gate control signal CTL is changed to the low level, and, accordingly, the complementary gate control signal CCTL is elevated to the high level.

The isolating circuit 26a comprises a transfer gate TG1 coupled between the data line pair DL4 and the input/output data buffer circuit 25d and a transfer gate TG2 coupled between the input/output data buffer circuit 25d and the ground voltage line GND. The transfer gates TG1 and TG2 are complementarily shifted between on-state and off-state, and couple the input/output data buffer circuit 25d with the lowest priority to the data line pair DL4 or the ground voltage line GND.

Upon completion of the fabrication process, the semiconductor memory device is subjected to a test sequence to see whether or not each of the memory cell sub-arrays 2a to 22d contains a defective memory cell not available for storing a data bit. If no defective memory cell is found in the memory cell sub-arrays 22a to 22d, the memory cell sub-arrays 22a to 22d are diagnosed as excellent memory cell sub-arrays.

On the other hand, when a defective memory cell or cells are found in one of the memory cell sub-arrays 22a to 22d, the defective row of regular memory cell and/or the defective column of regular memory cells are replaced with the row of redundant memory cells and/or the column of redundant memory cells, and the memory cell sub-array thus rescued through the redundant memory cells is also diagnosed to be the excellent memory cell sub-array. However, if a memory cell sub-array contains more than one defective row or more than one defective column, the redundant memory cells 22e and 22f can not rescue the memory cell sub-array, and the memory cell sub-array is diagnosed as a defective memory cell sub-array.

If all of the memory cell sub-arrays 22a to 22d are the excellent memory cell sub-arrays, the fuse element F31 is not broken, and the gate control signal CTL is maintained at the high level. As a result, the gate control signal CTL and the complementary gate control signal CCTL causes the transfer gate TG1 to connect the data line pair DL4 to the input/output data buffer circuit 25d, and the other transfer gate TG2 isolates the input/output data buffer circuit 25d from the ground voltage line GND.

For this reason, when the row selecting system 23 and the column selecting system 24 couple four regular/redundant memory cells respectively selected from the four memory cell sub-arrays 22a to 22d to the four data line pairs DL1 to DL4, the shifting circuit 26 couples the four data bits to the four input/output data buffer circuits 25a to 25d, and potential differences are transferred between the input/output data buffer circuits 25a to 25d and the four regular/redundant bit line pairs associated with the selected four regular/redundant memory cells.

If a defective memory cell sub-array is found through the test sequence, the fuse element F31 is broken for changing the gate control signal CTL to the low level, and the fuse elements F11–F13 and F21 and F23 are selectively broken for changing the connection between the data line pairs DL1 to DL4 and the input/output data buffer circuits 25a to 25c.

Figure 5:
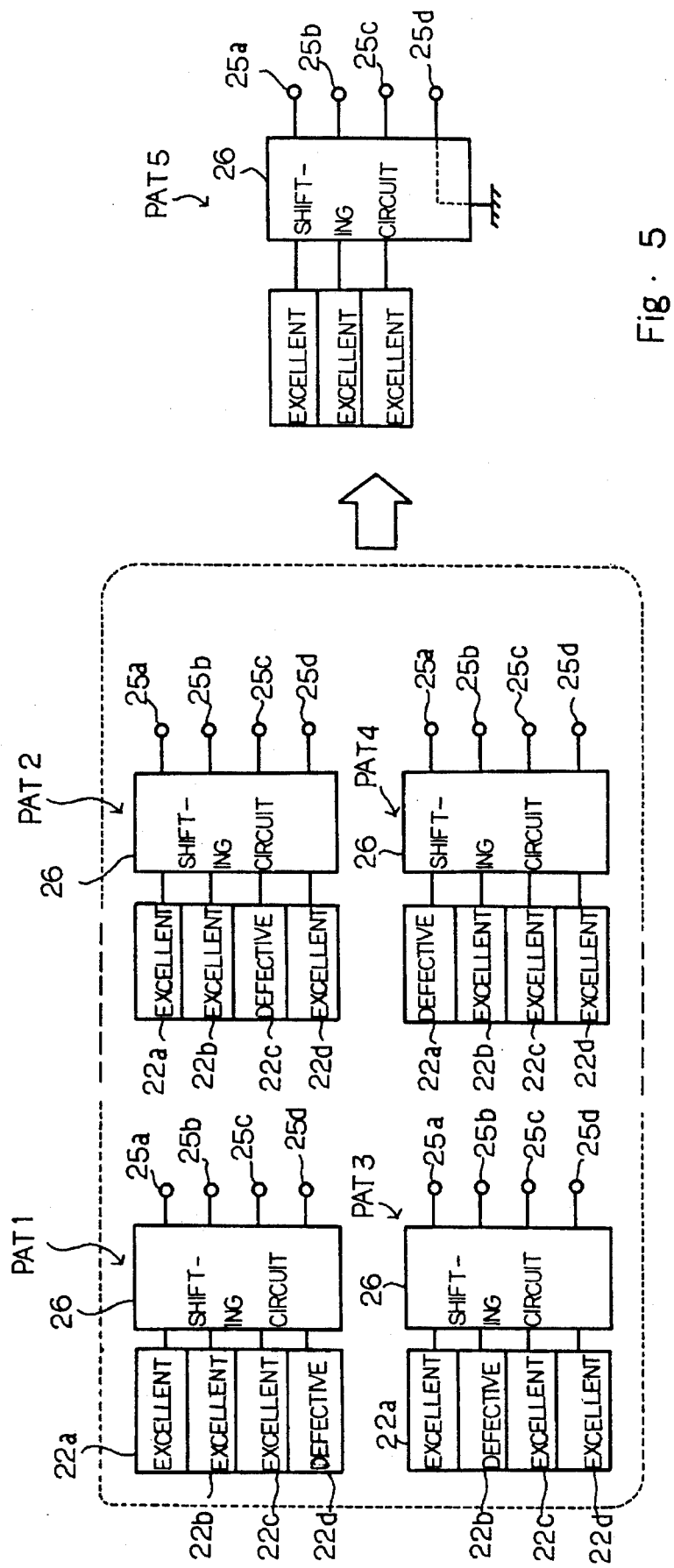
FIG. 5 is a view showing the function of a shifting circuit incorporated in FIG. 4.
Figure 7:
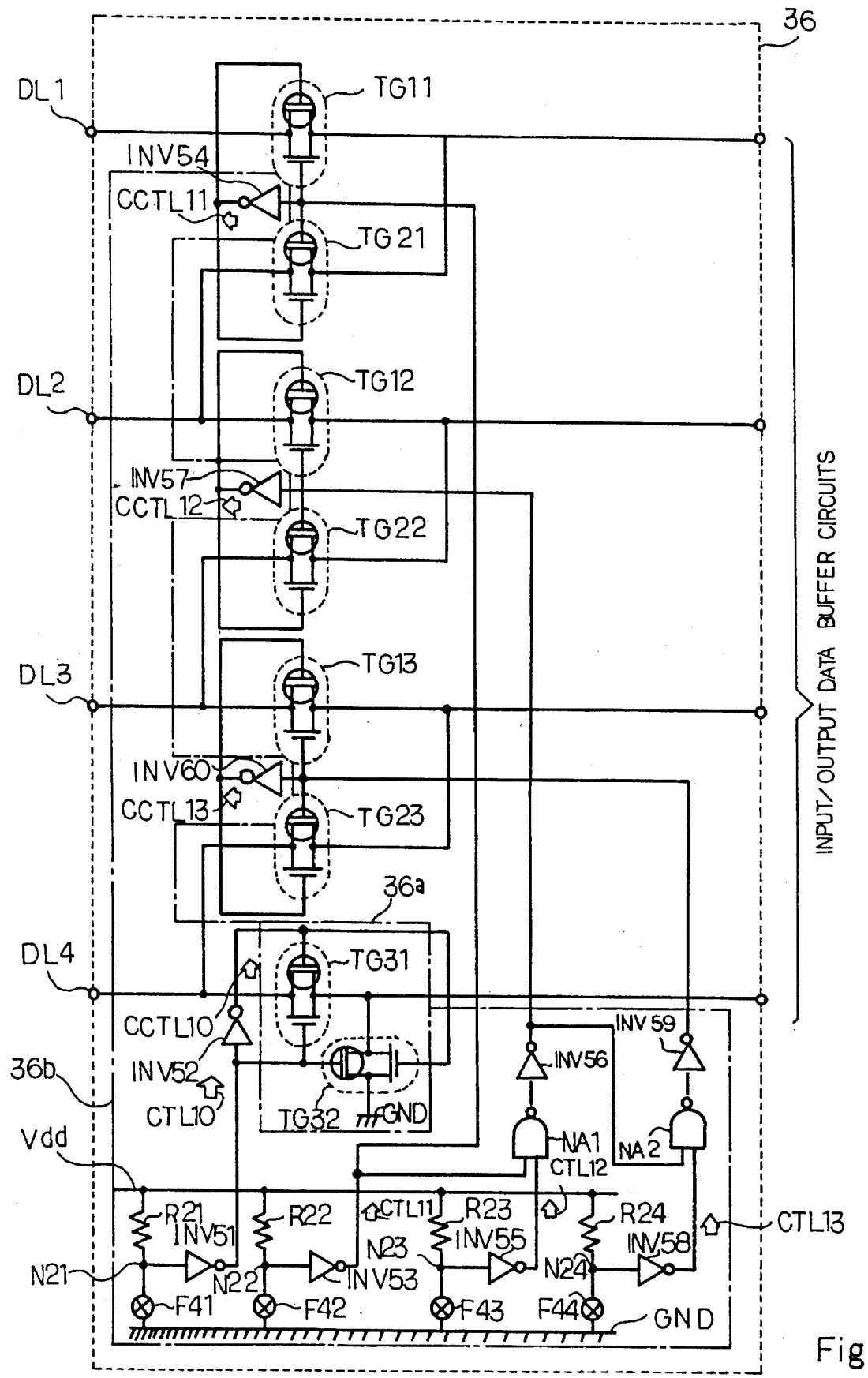
FIG. 7 is a circuit diagram showing the arrangement of a shifting circuit incorporated in another semiconductor memory device.

In detail, even if the defective memory cell sub-array is changed from the memory cell sub-array 22a to the memory cell sub-array 22d as indicated by four patterns PAT1, PAT2, PAT3 and PAT4 in FIG. 5, the shifting circuit connects the three excellent memory cell sub-arrays to the input/output data buffer circuits 25a to 25c in the order of priority.

FIG. 6 illustrates broken fuse elements depending upon the defective memory cell sub-array, and the broken fuse elements are labeled with "B". If all of the memory cell sub-arrays 22a to 22d are excellent, the fuse elements F21, F22 and F23 are broken, and the other fuse elements provide signal paths. If the memory cell sub-array 22a is defective, the fuse element F31 is broken for disabling the input/output data buffer circuit 25d, and the fuse elements F11, F12 and F13 are broken instead of the fuse element F21, F22 and F23.

On the other hand, if the memory cell sub-array 22b is defective, the fuse elements F21, F12 and F13 are broken together with the fuse element F31. The defective memory cell sub-array 22c requires the broken fuse elements F21, F22, F13 and F31, and the fuse elements F21, F22, F23 and F31 are broken for the defective memory cell sub-array 22d.

Thus, the shifting circuit 26 couples the excellent memory cell sub-arrays to the input/output data buffer circuits 25a, 25b and 25c at all times and the input/output data buffer circuit 25d to the ground voltage line GND regardless of the location of the defective memory cell sub-array. As a result, the manufacturer carries out test sequences through the input/output data buffer circuits 25a to 25c at all times, and a circuit board is shared between the rescued semiconductor memory device with partially excellent memory cell array 22.

Second Embodiment

Turning to FIG. 6 of the drawings, a shifting circuit 36 is connected between data line pairs DL1 to DL4 and input/output data buffer circuits incorporated in another semiconductor memory device embodying the present invention. The other components of the semiconductor memory device implementing the second embodiment are similar to those of the first embodiment, and are identified with the corresponding components of the first embodiment by using the same references in the following description.

The shifting circuit 36 largely comprises an isolating circuit 36a for the input/output data buffer circuit 25d with the lower priority, a gate controlling circuit 36b for producing gate control signals and the complementary gate control signals and transfer gates TG11, TG12, TG13, TG21, TG22 and TG23, and the fuse elements F11, F12, F13, F21, F22 and F23 are replaced with the transfer gates TG11, TG12, TG13, TG21, TG22 and TG23, respectively. The isolating circuit 36a and the gate control circuit 36b behave as similar to the isolating circuit 26a and the gate control circuit 26b, and the transfer gates TG11 to TG23 are selectively turned on and off by the gate control circuit 26b depending upon the location of a defective memory cell sub-array.

In this instance, the transfer gates TG11 to TG13 and the transfer gates TG21 to TG23 as a whole constitute a switching unit.

The isolating circuit 36a comprises a transfer gate TG31 coupled between the data line pair DL4 and the input/output data buffer circuit 25d and a transfer gate TG32 coupled between the input/output data buffer circuit 25d and the ground voltage line GND. The transfer gates TG31 and TG32 are complimentarily changed between on-state and off-state by a first gate control signal CTL10 and the complementary gate control signal CCTL10. Namely, if a defective memory cell sub-array is found through a test sequence, the first gate control signal CTL10 is fixed to the low level, and the first gate control signal CTL10 and the complementary gate control signal CCTL10 causes the transfer gate TG31 and the transfer gate TG32 to turn off and on. As a result, the input/output data buffer circuit 25d is isolated from the data line pair DL4, and is connected to the ground voltage line GND.

The gate control circuit 36b comprises series of resistors R21/R22/R23/R24 and fuse elements F41/F42/F43/ F44 coupled between a positive power voltage line Vdd and the ground voltage line GND, a series of inverters INV51 and INV52 coupled to a node N21 between the resistor R21 and the fuse element F41 for producing the first gate control signal CTL10 and the complementary gate control signal CCTL10, a series of inverters INV53 and INV54 coupled to a node N22 between the resistor R22 and the fuse element F42 for producing a second gate control signal CTL11 and the complementary gate control signal CCTL11, a series of an inverter INV55, a NAND gate NA1 and inverters INV56 and INV57 coupled to a node N23 between the resistor R23 and the fuse element F43 for producing a third gate control signal CTL12 and the complementary gate control signal CCTL12 and a series of inverter INV58, a NAND gate NA2 and inverters INV59 and INV60 coupled to a node N24 between the resistor R24 and the fuse element F44 for producing a fourth gate control signal CTL13 and the complementary gate control signal CCTL13.

If all of the memory cell sub-arrays 22a to 22d are excellent, all of the fuse elements are not broken, and the first to fourth gate control signals CTL10 CTL13 are maintained in the high level. As a result, the transfer gate TG31 connects the data line pair DL4 to the input/output data buffer circuit 25d, and the transfer gate TG32 blocks the input/output data buffer circuit 25d from the ground voltage line GND. Moreover, the second to fourth gate control signals CTL11 to CTL13 cause transfer gates TG11 to TG13 to couple the data line pairs DL1 to DL3 to the input/output data buffer circuits 25a to 25c, and the transfer gates TG21 to TG23 are turned off. Thus, the shifting circuit 36 allows the semiconductor memory device to serves as a four-bit parallel input/output data storage.

However, if one of the memory cell sub-arrays 22a to 22d is defective, the fuse element F41 is broken for changing the first gate control signal CTL10 to the low level, and the transfer gate TG32 fixes the input/output data buffer circuit 25d to the ground voltage level. The fuse elements F42 to F44 are selectively broken depending upon the location of the defective memory cell sub-array, and the excellent memory cell sub-arrays are coupled through the shifting circuit 36 to the input/output data buffer circuits 25a to 25c, respectively.

As will be appreciated from the foregoing description, the shifting circuit according to the present invention couples the excellent memory cell sub-arrays to the input/output data buffer circuits with the higher priority, and the defective memory cell sub-array is electrically isolated from the input/output data buffer circuit with the lower priority. As a result, the input/output data buffer circuits with the higher priority are available at all times regardless of the location of the defective memory cell sub-array, and the semiconductor memory device according to the present invention is convenient for not only the manufacturer but also user.

Although particular embodiments of the present invention have been shown and described, it will be obvious to those skilled in the art that various changes and modifications may be made without departing from the spirit and scope of the present invention.

For example, the present invention is applicable to a semiconductor memory device with more than four input/output data buffer circuits, and the isolating circuit may be provided for more than one input/output data buffer circuit.

Moreover, the fuse elements may be broken by using either laser beam or electric current, and the gate control circuit may be implemented by a built-in programmable read only memory circuit.

What is claimed is:

1. A semiconductor memory device comprising:
    a) a memory cell array divided into a plurality of memory cell sub-arrays each implemented by a plurality of addressable memory cells for storing internal data bits, respectively;

b) a plurality of data buffer circuits operative to change data bits between said internal data bits and external data bits, and having respective priorities different from one another;

c) an addressing means operative to couple selected addressable memory cells respectively selected from said plurality of memory cell sub-arrays to said plurality of data buffer circuits; and d) a shifting circuit coupled between said addressing means and said plurality of data buffer circuits, and operative to respectively connect said plurality of memory cell sub-arrays to said data buffer circuits when a defective memory cell sub-array with a defective memory cell is not incorporated in said plurality of memory cell sub-arrays, said shifting circuit being further operative to connect available memory cell sub-arrays without said defective memory cell to the data buffer circuits in an order of said priority and to isolate said defective memory cell sub-array or sub-arrays from the data buffer circuit or circuits lower in said priority.

2. The semiconductor memory device as set forth in claim 1, in which said plurality of addressable memory cells of each memory cell sub-array are broken down into regular addressable memory cells and redundant addressable memory cells with which said defective memory cell or cells contained in said regular addressable memory cells are replaced.

3. The semiconductor memory device as set forth in claim 1, in which said plurality of addressable memory cells of each memory cell sub-array are broken down into regular addressable memory cells and redundant addressable memory cells with which said defective memory cell or cells contained in said regular addressable memory cells are replaced, and in which said addressing means comprises a plurality of sets of regular and redundant data propagation paths respectively associated with said plurality of memory cell sub-arrays, the regular and redundant data propagation paths of each of said plurality of sets being selectively coupled to said regular addressable memory cells and said redundant addressable memory cells for supplying data bits therefrom and thereto, a plurality of sets of regular and redundant word lines respectively associated with said plurality of memory cell sub-arrays, the regular and redundant word lines of each of said plurality of sets being selectively coupled to said regular addressable memory cells and said redundant addressable memory cells and operative to connect the associated regular addressable memory cells or said redundant addressable memory cells to said plurality of regular and redundant data propagation paths when said regular and redundant word lines are selectively activated, a row selecting system responsive to first address signals for energizing one of said regular and redundant word lines of each of said plurality of sets of regular and redundant word lines, and a column selecting system responsive to second address signals for coupling regular and redundant data propagation paths respectively selected from said plurality of sets of regular and redundant data propagation paths to said plurality of data buffer circuits.

4. The semiconductor memory device as set forth in claim 1, in which said shifting circuit comprises a gate control circuit producing gate control signals indicative of existence of said defective memory cell sub-array or sub-arrays, an isolating circuit coupled between said data buffer circuit or circuits lower in said priority and a source of constant voltage for supplying the constant voltage to said data buffer circuit or circuits lower in said priority when said defective memory cell sub-array or sub-arrays exist, said isolating circuit coupling said data buffer circuit or circuits lower in said priority through said addressing means to one or ones of said plurality of memory cell sub-arrays when said defective memory cell sub-array is not incorporated in said plurality of memory cell sub-arrays, and a switching unit coupled between said addressing means and said data buffer circuits and operative to couple the others of said plurality of memory cell sub-arrays to the data buffer circuits higher in said priority when said defective memory cell sub-array is not incorporated in said plurality of memory cell sub-arrays, said switching unit being further operative to couple said available memory cell sub-arrays to said data buffer circuits higher in said priority when said defective memory cell sub-array or arrays are incorporated in said plurality of memory cell sub-arrays.

5. The semiconductor memory device as set forth in claim 4, in which said switching unit comprises a plurality of first blowable fuse elements for electrically connecting said plurality of memory cell sub-arrays except for the plurality of memory cell sub-array or sub-arrays coupled to the data buffer circuit or circuits lower in said priority to said plurality of data buffer circuits higher in said priority, respectively, and a plurality of second blowable fuse elements respectively paired with said plurality of first blowable fuse elements for forming a plurality of blowable fuse pairs, and connecting said others of said plurality of memory cell sub-arrays to said data buffer circuits higher in said priority, said plurality of second blowable fuse elements being broken when said defective memory cell sub-array is not incorporated in said plurality of memory cell sub-arrays, either first or second blowable fuse element of each blowable fuse pair being broken depending upon the location of said defective memory cell sub-array or sub-arrays in said plurality of memory cell sub-arrays.

6. The semiconductor memory device as set forth in claim 4, in which said switching unit comprises a plurality of first transfer gates operative to electrically connect said plurality of memory cell sub-arrays except for the memory cell sub-array or sub-arrays coupled to the data buffer circuit or circuits lower in said priority to said plurality of data buffer circuits, respectively, and a plurality of second transfer gates respectively paired with said plurality of first transfer gates for forming a plurality of transfer gate pairs, and operative to connect said others of said plurality of memory cell sub-arrays to said data buffer circuits higher in said priority, said plurality of first transfer gates and said plurality of second transfer gates being turned on and off, respectively, when said defective memory cell sub-array is not incorporated in said plurality of memory cell sub-arrays, either first or second transfer gate of each transfer gate pair being turned on depending upon the location of said defective memory cell sub-array or sub-arrays in said plurality of memory cell sub-arrays.

* * * * *